United States Patent [19]

Snyder et al.

[11] Patent Number: 4,864,369
[45] Date of Patent: Sep. 5, 1989

[54] P-SIDE UP DOUBLE HETEROJUNCTION ALGAAS LIGHT-EMITTING DIODE

[75] Inventors: Wayne L. Snyder; Dennis C. DeFevere, both of Palo Alto; Frank M. Steranka, San Jose; Chin-Wang Tu, Cupertino, all of Calif.

[73] Assignee: Hewlett-Packard Company, Palo Alto, Calif.

[21] Appl. No.: 214,997

[22] Filed: Jul. 5, 1988

[51] Int. Cl.$^4$ .......................... H01L 33/00; H01S 3/19
[52] U.S. Cl. ........................................ 357/17; 357/16
[58] Field of Search .................................... 357/16, 17

[56] References Cited

U.S. PATENT DOCUMENTS 4,615,032  9/1986  Holbrook ............................. 357/17
4,701,774  1/1987  McIlroy et al. .
4,719,497  1/1988  Tsai ..................................... 357/17

OTHER PUBLICATIONS

Ishiguro, "High-Efficient GaAlAs Light Emitting Diodes of 660 nm with a Double Heterostructure on a GaAlAs Substrate", Appl. Phys. Lett., vol. 43, No. 11, 12/83.

Kressel and Butler, *Semiconductor Lasers and Heterojunction LEDs*, 1977, Section 14.6, pp. 510–521.

Primary Examiner—Andrew J. James
Assistant Examiner—David Soltz
Attorney, Agent, or Firm—Patrick J. Barrett

[57] ABSTRACT

A semiconductor light emitting heterostructure device is disclosed. The device comprises an n-type GaAs substrate, a first n-type layer of AlGaAs adjacent to the substrate, a second p-type light emitting AlGaAs layer adjacent to the first layer, and a third p-type AlGaAs layer suitable for bonding to an aluminum contact. The device starts with an n-type substrate which is more readily available and has a p-side up configuration which is more suitable for bonding to an aluminum contact.

7 Claims, 2 Drawing Sheets

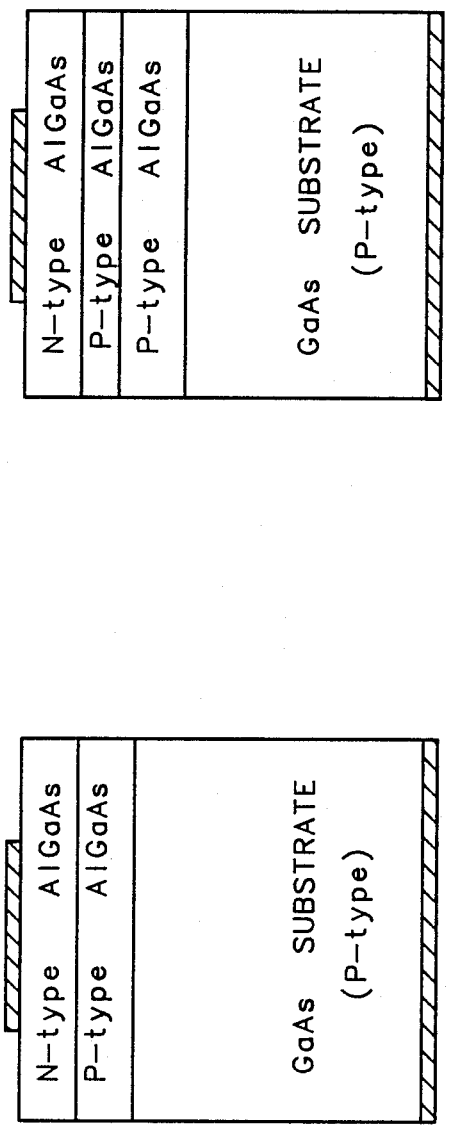

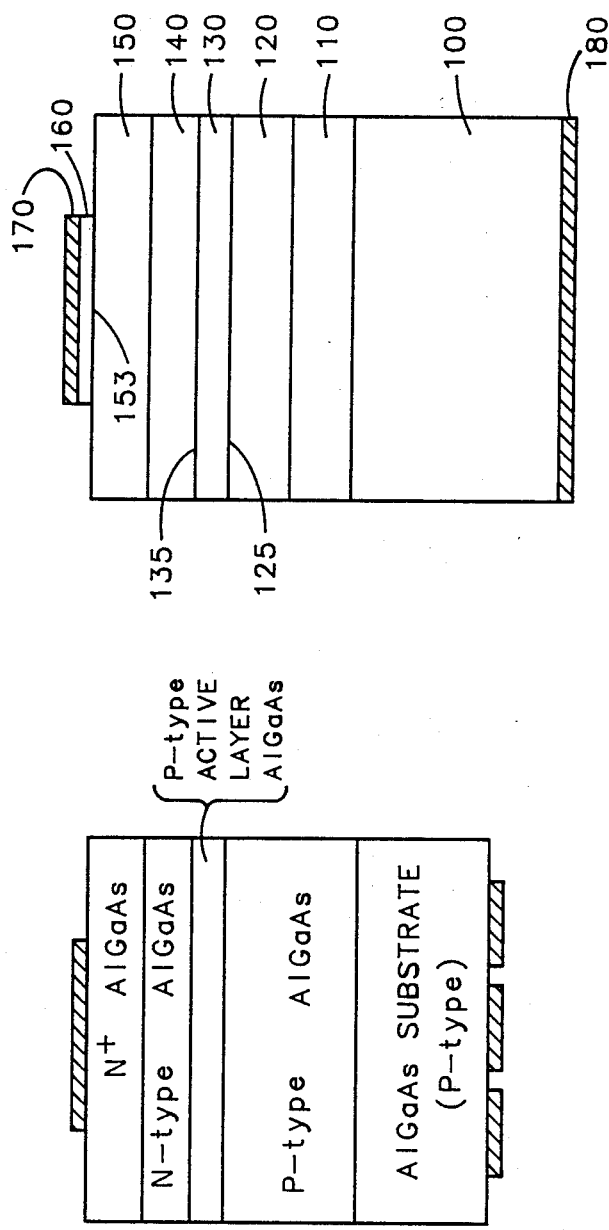

P-SIDE UP DOUBLE HETEROJUNCTION AlGaAs LIGHT-EMITTING DIODE

BACKGROUND OF THE INVENTION

This invention relates in general to electroluminescent devices and in particular to a double heterojunction semiconductor light emitting diode.

Light emitting diodes (LED's) are frequently used for displays and indicators as well as laser sources. In one type of LED, a p-n junction semiconductor is employed. A potential difference is applied across the junction by means of a pair of electrode contacts in contact with the p-type and n-type regions. This causes electrons to be injected across the junction from the n-type region to the p-type region and causes holes to be injected across the junction from the p-type region to the n-type region. In the p-type region, the injected electrons recombine with the holes resulting in light emissions; in the n-type region, the injected holes recombine with electrons resulting in light emission. The wavelength of the light emission depends on the energy generated by the recombination of electrons and holes; which is known as the band gap of the p-n junction semiconductor material.

To enhance the efficiency of light emission, it is known to those skilled in the art to be preferable to cause only one of the two types of carriers, namely electrons or holes, to be injected across the junction, but not both. In improved LEDs, a p-n single heterojunction semiconductor is employed. A heterojunction is formed at the junction between a p-type and a n-type semiconductor materials of different band gaps. In such heterojunction devices, the energy band gap in the p-type region is different from that in the n-type region so that either electrons or holes, but not both, are injected across the junction. The injected electrons or holes then recombine to cause light emission. Typically, the materials of the n-type and p-type regions are chosen so that only electrons are injected across the junction from the n-type to the p-type region so that the p-type region becomes the only active light emitting portion of the LED.

In conventional LED devices, p-type and n-type layers are grown on a substrate to form the p-n junction. One common substrate material used in LED's is gallium arsenide. If the semiconductor is composed of gallium arsenide (GaAs), the energy band gap of the semiconductor material can be increased with substitution of aluminum atoms for gallium atoms. The greater the content of aluminum in the material, the higher is the band gap. In conventional single heterojunction LEDs employing GaAs as the semiconductor material, a single p-n junction is formed by growing on a GaAs substrate a p-type layer followed by a n-type layer. It is known to substitute aluminum for gallium in both the n-type and p-type regions, where the n-type region contains more aluminum and thus wider band gap than the p-type region. This has the effect of causing the electrons injected from the n-type region to the p-type region to have a lower potential barrier than the holes injected in the opposite direction. Thus, essentially only electrons will be injected across the junction, and the p-type layer is the active layer where radiative recombinations take place.

Since the GaAs substrate on the bottom side and the metal electrode contact at the top absorb the light emitted by the active gallium aluminum arsenide (AlGaAs) p-type region, it is desirable to provide windows between such light absorbent obstacles and the active region to increase the percentage of light that can be utilized. The n-type layer is chosen to be thick to provide a window.

A device known as double heterojunction LED improves on the efficiency of single heterojunction LED's. By inserting an additional p-type layer of higher band gap material between the p-active layer and the substrate, a second junction is effected between the two p-type layers. The extra higher band gap p-type layer helps to confine the injected electrons and prevent them from diffusing deeply into the p-active layer, thereby inducing them to rapidly recombine with the holes to produce more efficient light emissions. Also the extra p-type layer provides a further window for light out of the p-active layer.

In the conventional devices described above, the LEDs have p-type substrates so that the last or top layer being grown is of the n-type. This is disadvantageous for two reasons. Since most of the light will escape from the active layer from the top n-type layer, a small ohmic contact obscuring only a small part of the surface will reduce the amount of blocking. A small contact requires a good bonding to the surface, and sufficiently good contacts to an n-type layer are more complex, such as ones made of gold-germanium alloys. Furthermore, low dislocation p-type GaAs substrates are not as readily available as their n-type counterparts. It is therefore desirable to provide double heterojunction LED structures in which such difficulties are alleviated.

SUMMARY OF THE INVENTION

This invention is directed towards a semiconductor light emitting heterostructure device. The device comprises an n-type GaAs substrate, a first n-type layer of AlGaAs adjacent to the substrate. The device further comprises a second p-type light emitting AlGaAs layer adjacent to the first layer and a third p-type AlGaAs layer suitable for bonding to an aluminum contact. The second layer has an aluminum content different from those of the first and third layers so that the three layers form a double heterostructure.

By employing an n-type GaAs substrate, it is unnecessary to use low dislocation p-type GaAs substrates. Since the top layer will be a p-type AlGaAs layer, the top layer is suitable for bonding to an aluminum contact. This eliminates the need for gold alloy type contacts which are more complex and difficult to use.

Additional objects, features and advantages of the present invention will become apparent from the following description of a preferred embodiment thereof, which description should be taken in conjunction with the accompanying drawings.

BRIEF DESCRIPTION OF THE DRAWINGS

FIG. 1A shows a cross-sectional schematic view of a conventional single heterojunction red LED;

FIG. 1B shows a cross-sectional schematic view of a conventional double heterojunction red LED;

FIG. 1C shows a cross-sectional schematic view of a transparent substrate, double heterojunction red LED according to prior art;

FIG. 2 shows a cross-sectional schematic view of an absorbing substrate, double heterojunction red LED according to the present invention.

DETAILED DESCRIPTION OF THE PREFERRED EMBODIMENT

Two types of AlGaAs LEDs are known. One type employs a GaAs substrate which absorbs the light emitted by the p-active layer. Another type is known as the transparent substrate LED, which is obtained by growing a thick layer of AlGaAs substrate and other layers on top of a GaAs wafer and then removing the GaAs wafer. Since the transparent substrate LED has a transparent substrate, it typically has a light emission efficiency which is typically two or three times those of LEDs with opaque GaAs substrates. However, since the transparent substrate LED requires the growing of a thick AlGaAs substrate layer and the removal of the GaAs wafer, both of which are difficult and costly, the transparent substrate LED is much more expensive than the opaque substrate counterparts.

FIGS. 1A, 1B show various conventional forms of heterojunction LED with opaque substrates. FIG. 1A illustrates the structure of a conventional single heterojunction red LED formed by growing a p-active layer of AlGaAs on a p-type GaAs substrate and a n-type layer of AlGaAs on the p-type AlGaAs layer.

FIG. 1B illustrates a conventional double heterojunction LED which is more efficient than the single heterojunction LED of FIG. 1A. Here, an extra p-type layer is inserted between the substrate and the p-active layer. The extra p-type layer helps to confine the injected electrons so that they will recombine with holes to provide more efficient light emission instead of diffusing deeply into the p-active layer Also the extra p-type layer provides a further window for light out of the p-active layer.

Both LEDs of FIGS. 1A and 1B are of the absorbing substrate type, where light generated from the p-n junction is lost when it hits the substrate.

FIG. 1C illustrates a double heterojunction LED which is of the transparent substrate type, and therefore is even more efficient than that of FIG. 1B. This type of LED, disclosed by Ishiguro et al in Applied Physics Letters, Vol. 43, No. 11, pages 1034–1036, Dec. 1, 1983, is much more difficult and costly to make since the process involves growing various transparent layers on an absorbing substrate which is subsequently removed. One of the transparent layers will then serve as a substitute substrate and therefore must be grown sufficiently thick, which is a costly and time consuming process. Ishiguro et al reports a AlGaAs red LED with a high efficiency of 8%.

In all cases of FIGS. 1A–1C, the devices have the n-side up configuration and therefore share in common two disadvantages. One is the need for a more complex ohmic contact. Since most of the light will come out from the up-side, a small ohmic contact obscuring only a small part of the surface needs be used to minimize blockage of light. A small contact requires a good bonding to the surface, and sufficiently good contacts to a n-type layer are more complex, such as ones made of gold-germanium alloys. The other disadvantage is that a n-side up structure requires a p-type substrate as the starting material, and low dislocation p-type GaAs substrate is not as readily available as the n-type counterpart.

FIG. 2 shows a cross-sectional schematic view of an absorbing substrate, double heterojunction red LED according to the present invention. A wafer of n-type, single crystal gallium arsenide (GaAs) 100, preferably of thickness 200 microns serves as a substrate.

A first layer 110 of n-type aluminum gallium arsenide (AlGaAs), having a thickness preferably in the range of 2 to 10 microns, is formed on the n-type substrate 100 by conventional techniques such as liquid phase epitaxial (LPE) growth.

A second layer 120 of n-type' AlGaAs, having a thickness preferably in the range of 2 to 10 microns, is formed on the first n-type AlGaAs layer 110 by conventional techniques such as (LPE) growth.

The two n-layers 110 and 120 both have the composition $Al_xGa_{1-x}As$ where x is preferably in the range of 0.60 to 0.90. The dopings of the two n-type layers are optimized for different considerations. Tin or tellurium is favorably used as n-dopants. The first n-type layer 110 preferably has a dopant concentration of mid $10^{17}$ to mid $10^{18}$ atoms per cubic centimeter. This prevents a high resistance layer at the substrate interface defined by the substrate layer 100 and the second n-type layer 120. The second n-type layer is less heavily doped, preferably with a dopant concentration of mid $10^{16}$ to mid $10^{17}$ atoms per cubic centimeter, so that it is optimized for light output efficiency at the p-n heterojunction described below. While in the preferred embodiment, the first and second n-type layers are separate for the reasons above, it will be understood that they can form simply one layer; such variations are within the scope of the invention.

A third thin p-active layer of AlGaAs 130 is formed over the second n-type AlGaAs layer, also by LPE growth methods. This is the layer where light is generated. The p-active layer 130 preferably has a thickness in the range of 0.05 to 5 microns and a composition of $Al_xGa_{1-x}As$ where x is preferably in the range of 0.35 to 0.45. A first heterojunction 125 is thereby effected by the second n-type AlGaAs layer 120 and the third p-active layer 130.

A fourth p-type AlGaAs layer 140, having a thickness preferably in the range of 2 to 20 microns, is formed over the third p-active layer 120 by conventional techniques, such as LPE growth. The fourth layer 140 has a composition of $Al_xGa_{1-x}As$ where x is preferably in the range of 0.60 to 0.90. This insures good confinement and good reliability performance. A second heterojunction 135 is thereby effected by the third p-active layer 130 and the fourth p-type AlGaAs layer 140.

A fifth p-type AlGaAs layer 150, having the thickness preferably in the range of 10 to 30 microns, is formed over the fourth p-type AlGaAs layer 140 by conventional techniques such as LPE growth methods. The fifth layer 150 has a composition of $Al_xGa_{1-x}As$ where x is preferably in the range of 0.40 to 0.90. It is grown to be a lower Al composition than the fourth layer 140. This is desirable since a thicker layer can be grown when using the cool-down LPE epitaxial growth process without quickly depleting the Al stock. A thicker layer ensures better structure reliability and more importantly, provides a larger window for light output.

The three p-type layers 130, 140 and 150 have similar dopant concentrations, preferably in the range of $10^{17}$ to $10^{18}$ atoms per cubic centimeter. Zinc or magnesium is favorably used as p- dopants.

A pre-contact layer 160, preferably of GaAs, is formed over the contact region 153 of the fifth p-type AlGaAs layer 150. This layer is optional and, depending on the type of contact used, serves to improve the otherwise marginal bonding of the contact to the device. In those cases where the type of contact used is able to make acceptable contact to the fifth layer 150, this pre-contact layer 160 may be omitted. Generally, the higher the concentration of Al in the AlGaAs layer, the more difficult it is to make ohmic contact on it, and it is easier to use a GaAs pre-contact layer as an interface. The pre-contact layer 160 is p-doped, preferably with a dopant concentration of $10^{19}$ atoms per cubic centimeter, to provide a low impedance interface.

A contact 170 is then formed over the pre-contact layer 160 in the contact region 153 by conventional techniques, such as evaporation. In the preferred embodiment, the contact 170 is made of aluminum.

Another contact layer 180 is then formed over the remaining surface of the n-type GaAs substrate 100 by conventional methods, such as evaporation. The contact layer 180 is preferably made of gold-germanium alloy.

The advantage of this structure of the present invention is that it allows the making of very efficient (external quantum efficiency of the order of 7%) absorbing substrate, double heterojunction red AlGaAs structure in a p-side up configuration. A p-side up configuration allows for simple ohmic contact since aluminum is readily bonded to p-type AlGaAs or GaAs. On the other hand, aluminum cannot be used with the conventional n-side up devices. Furthermore, it allows for the use of readily available low dislocation n-type GaAs substrates. The ohmic contact to the substrate, albeit a n-type, is much less demanding than that to the top layer, since it covers a much larger area and is usually glued onto the LED casing with conducting epoxy.

Although the various aspects of the present invention have been described with respect to its preferred embodiments, it will be understood that the invention is to be protected within the scope of the appended claims.

We claim:

1. A semiconductor light emitting heterostructure device comprising:
   an n-type GaAs substrate;
   a first n-type layer of AlGaAs adjacent to the substrate;
   a second p-type light emitting AlGaAs layer adjacent to the first layer; and
   a third p-type AlGaAs layer suitable for bonding to an aluminum contact;
   said second layer having an aluminum content different from those of the first and third layers so that the three layers form a double heterostructure; and
   said first n-type layer further comprises:
   an epitaxially grown fourth layer adjacent to the substrate, said fourth layer doped to reduce the resistance of the interface between the substrate and the fourth layer when the fourth layer is grown on the substrate; and
   a fifth layer more lightly doped compared to the fourth layer to optimize the light output efficiency at the p-n junction.

2. The device of claim 1, wherein the first layer is composed of $Ga_{1-x}Al_xAs$, where x is within the range 0.6 to 0.9.

3. A semiconductor light emitting heterostructure device comprising:
   an n-type GaAs substrate;
   a first n-type layer of AlGaAs adjacent to the substrate;
   a second p-type light emitting AlGaAs layer adjacent to the first layer; and
   a third p-type AlGaAs layer suitable for bonding to an aluminum contact;
   said second layer having an aluminum content different from those of the first and third layers so that the three layers form a double heterostructure; and
   said third p-type AlGaAs layer further comprises:
   a fourth layer adjacent to the second layer, and fourth layer having a composition so that its band gap barrier is high relative to that of the second layer to increase the light output efficiency of the device; and
   a fifth layer adjacent to the fourth layer, said fifth layer being thicker than the fourth layer so that less light is blocked by any contact connected to said fifth layer.

4. The device of claim 3, wherein the aluminum content of the seventh layer is such that the band gap of the seventh layer is substantially differently from that of the light emitting second layer so that it is transparent at least for some wavelengths of the light emitted by the second layer.

5. The device of claim 3, wherein the fourth layer is composed of $Ga_{1-x}Al_xAs$, where x is within the range 0.6 to 0.9.

6. The device of claim 3, wherein the fifth layer is composed of $Ga_{1-x}Al_xAs$, where x is within the range 0.40 to 0.90.

7. The device of claim 3, wherein said first n-type AlGaAs layer further comprises:
   an epitaxially grown sixth layer adjacent to the substrate, said sixth layer doped to reduce the resistance of the interface between the substrate and the sixth layer when the sixth layer is grown on the substrate; and
   a seventh layer more lightly doped compared to the sixth layer to optimize the light output efficiency at the p-n junction.

* * * * *